(12) United States Patent
Kise et al.

(10) Patent No.: US 6,922,458 B2
(45) Date of Patent: Jul. 26, 2005

(54) X-RAY EXPOSURE METHOD

(75) Inventors: Koji Kise, Hyogo (JP); Hiroshi Watanabe, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 134 days.

(21) Appl. No.: 10/662,514

(22) Filed: Sep. 16, 2003

(65) Prior Publication Data

US 2004/0247077 A1 Dec. 9, 2004

(30) Foreign Application Priority Data

Mar. 25, 2003 (JP) ..................................... 2003-082588

(51) Int. Cl.⁷ .............................................. G21K 5/00
(52) U.S. Cl. ..................................................... 378/34
(58) Field of Search .......................................... 378/34

(56) References Cited

U.S. PATENT DOCUMENTS

| | | |
|---|---|---|
| 2002/0196896 A1 | 12/2002 | Kitayama et al. |
| 2003/0099324 A1 | 5/2003 | Itoga et al. |
| 2003/0152190 A1 | 8/2003 | Watanabe et al. |

OTHER PUBLICATIONS

T. Takigawa, "The Innovation of ULSI Lithography" *Science Forum Co. Ltd., 1995*, pp. 222, 1st edition. Unable to evaluate foreign language.

Kise et al., "Suppression of Secodary Electron Blur By Using Br–Containing Resists In X–Ray Lithography", *Journal of Vacuum Science & Tech. B., The Society Through the American Institute of Physics*, 2002, pp. 2953–2957, 20(6.).

K. Itoga et al., "Effect of Secondary Electron from the Substrate In X–Ray Lithography Using Harder Radiation Spectra", *Journal of Vacuum Science & Tech. B., The Society Through the American Institute of Physics*, 2001, pp. 2439–2443, 19(6).

*Primary Examiner*—Craig E. Church
(74) *Attorney, Agent, or Firm*—Leydig, Voit & Mayer, Ltd.

(57) ABSTRACT

A resist is on a substrate with a lower layer film between the resist and the substrate. The lower layer film includes chemical elements and the element absorbing the largest amount of x-rays is carbon. The thickness of the lower layer film is determined by considering the influences of secondary electrons from the substrate and the carbon of the lower layer film. The resist includes chlorine, or a similar element, having a specific absorption edge. Under such conditions, the average wavelength of x-rays absorbed in the resist is in a prescribed range. In this way, in x-ray exposure, blur caused by secondary electrons is suppressed using a wavelength region of relatively shorter wavelengths.

3 Claims, 7 Drawing Sheets

A:FILM THICKNESS>RANGE
B:FILM THICKNESS>RANGE (THINNER THAN A)
C:FILM THICKNESS>RANGE (THINNER THAN A, B)
D:FILM THICKNESS<RANGE

RECTANGULAR OPTICAL IMAGE

BLUR CAUSED BY SECONDARY ELECTRONS

DISTRIBUTION OF ENERGY ACCUMULATED IN RESIST

X-RAY EXPOSURE METHOD

BACKGROUND OF THE INVENTION

1. Field of the Invention

The present invention relates to an x-ray exposure method directing x-rays generated from an x-ray source to illuminate a resist through a mask.

2. Description of the Background Art

The resolution in x-ray exposure is considered to be determined by two factors that have different causes: resolution limit of optical images determined by Fresnel diffraction, and that of pattern blur (hereinafter simply referred to as blur) caused by exposure of a resist by secondary electrons generated within the resist by the reflection of exposed light. These secondary electrons include photoelectrons and Auger electrons.

The resolution limit L determined by Fresnel diffraction is provided by:

$$L = k \times (\lambda \times D)^{1/2}$$

where k is a constant, $\lambda$ is an exposure wavelength, and D is the distance between an x-ray mask and a wafer. This equation shows that, the shorter the exposure wavelength and the smaller the distance between the x-ray mask and the wafer, the higher the resolution obtained.

On the other hand, blur caused by secondary electrons generated in a resist by x-ray irradiation has been considered to decrease as the exposure wavelength increases, as described by Takigawa in "The Innovation of ULSI Lithography", published by Science Forum Co. Ltd., 1st edition, at page 222. Thus, it has been considered that the longer the exposure wavelength, the higher the resolution obtained.

Meanwhile, Koji Kise et al in "Suppression of secondary electron blur by using Br-containing resists in x-ray lithography", Journal of Vacuum Science & Technology B, The Society Through the American Institute of Physics, Vol. 20, No. 6, Nov/December 2002, at pages 2953–2957, describe that blur caused by secondary electrons is suppressed by including an element Br in a resist.

Based on the conventional findings described above, as far as the optimal exposure wavelength is concerned, the influence of Fresnel diffraction on the resolution conflicts with that of blur caused by secondary electrons: exposure wavelength is preferably short in order to decrease the influence of Fresnel diffraction, whereas the exposure wavelength is preferably long in order to decrease the influence of blur caused by secondary electrons.

On account of these influences, for example when the distance between an x-ray mask and a wafer is 5 $\mu$m, it has been considered that around 8 angstroms is the optimal exposure wavelength and the resolution deteriorates when the exposure wavelength is shorter than this, as shown in the graph of FIG. 3 in "The Innovation of ULSI Lithography", at page 222.

SUMMARY OF THE INVENTION

An object of the present invention is to provide an x-ray exposure method directing x-rays while suppressing blur caused by secondary electrons using a region of wavelengths shorter than those of x-rays used for conventional x-ray exposure.

According to the x-ray exposure method of the present invention, x-rays generated by an x-ray source is directed through an x-ray mask to illuminate a resist that has been stacked on a substrate with a lower layer film posed therebetween. In this method, the lower layer film contains an element C, and is composed such that the element which absorbs the largest amount of x-rays of all the elements contained in the lower layer film is the element C. When the film thickness of the lower layer film is t (nm), the density of the lower layer film is $\rho$ (g/cm$^3$), the absorption edge of the element that absorbs the largest amount of x-rays of all the elements contained in the substrate is As (angstrom), the K-shell absorption edge of the element C is Ac (angstrom), and the absorption edge of the element that absorbs the largest amount of x-rays of all the elements contained in the resist is Ar (angstrom), then the average wavelength $\lambda$ (angstrom) of x-rays absorbed in the resist satisfies the relation: $0.5 \times Ar < 12.4/((t \times \rho/46)^{(1/1.75)} + 12.4/Ac) < Ar$ is satisfied, and the relation: $12.4/((t \times \rho/46)^{(1/1.75)} + 12.4/As) \leq \lambda \leq Ar$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
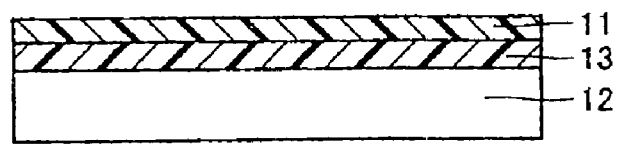
FIG. 3 is a cross section of a structure of a substrate provided with a resist and lower layer film.

According to the x-ray exposure method of the present invention, x-rays are used to illuminate a resist 11 stacked on a substrate 12 as shown in FIG. 3 with a lower layer film 13 in between, lower layer film 13 being composed in such a way that the element that absorbs the largest amount of x-rays of all the elements contained therein is the element C. In this method of exposure, the present invention was made by noting a difference between the energy of secondary electrons generated by the element C contained in lower layer film 13 and the energy of secondary electrons generated by Si, $SiO_2$ and the like that compose substrate 12. By noting this difference, it has been found that blur caused by second electrons increases when the wavelength is in a wavelength region dependent on the film thickness of the lower layer film.

According to the present invention, this region of more blur, which has been discovered as a novelty, is eliminated by adding into a resist an element having a specific absorption edge within the exposure wavelength. This additional element can advantageously suppress blur caused by secondary electrons when the wavelength is in a specific wavelength region. Thus, x-ray exposure is performed using a wavelength region of short wavelengths while blur by secondary electrons is suppressed.

Figure 1:
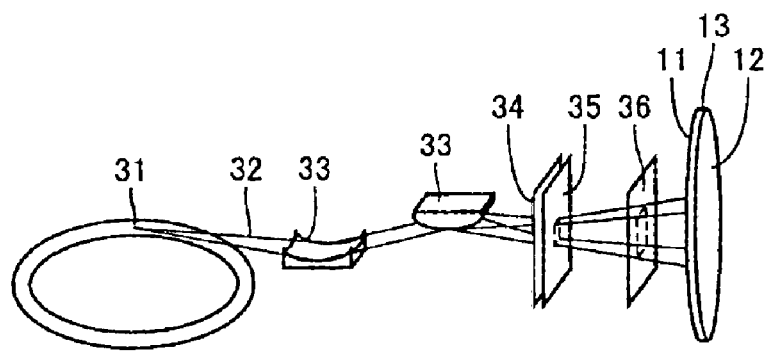
FIG. 1 is a perspective view illustrating an exposure system used in the present invention.

FIG. 1 illustrates an x-ray exposure system used in an embodiment of the present invention. As shown in FIG. 1, x-rays 32 that have been radiated from a radiation generating device (SR (Synchrotron Radiation) device) 31 as an x-ray source, are reflected by a mirror 33 and transmitted through a filter 34, a beryllium window 35 and an x-ray mask 36. The x-rays transmitted therethrough are irradiated upon a resist 11 stacked on a substrate 12 upon which transferring is performed, with a lower layer film 13 between them.

Figure 2:
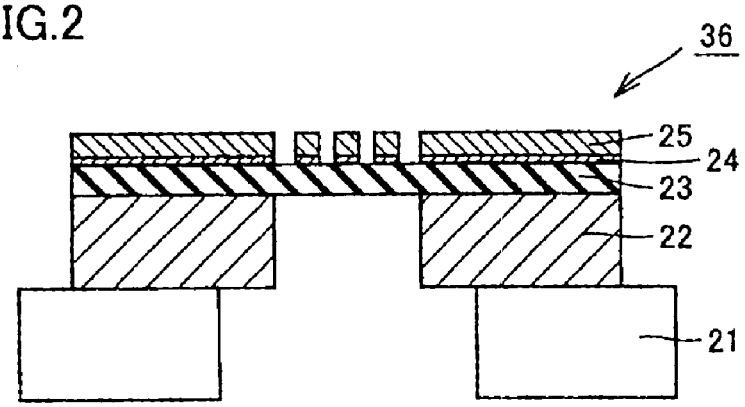
FIG. 2 is a cross section of a structure of an x-ray mask.

FIG. 2 shows a structure of x-ray mask 36. As shown in FIG. 2, an Si substrate 22 is etched on its backside and adhered on a support ring 21. Deposited on Si substrate 22 are a membrane 23 and an etching stopper 24. An x-ray absorber 25 is formed thereupon in a prescribed pattern.

First, the effect of suppression of secondary electrons caused by an element contained in resist 11 will be described. The above-mentioned "Suppression of secondary electron blur by using Br-containing resists in x-ray lithography" describes the effect of suppression of secondary electrons when the element Br is added to resist 11. More generally, by adding an element with a certain absorption edge in the exposure wavelength, blur caused by secondary electrons is suppressed when the wavelength is within the region between the absorption edge and half of it.

Figure 4:
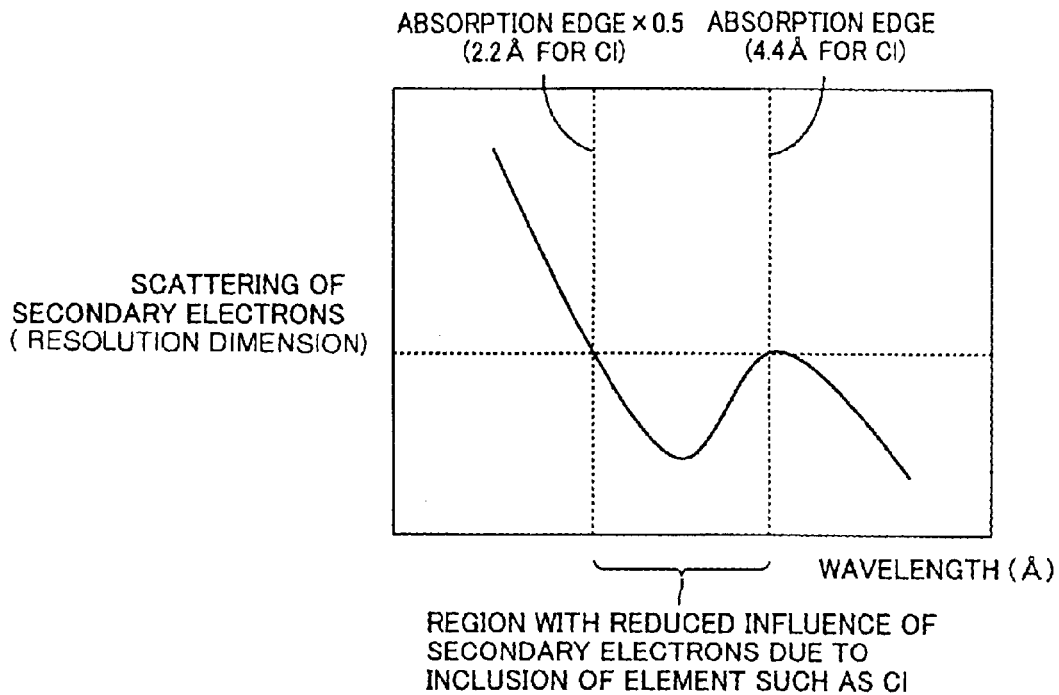
FIG. 4 is a graph showing the effect of decreased secondary electrons brought about by elements added to the resist.

This is shown as an example in FIG. 4, which shows scattering of secondary electrons, that is resolution dimension, for each exposure wavelength in the middle of a resist that has a sufficient thickness relative to the range of secondary electrons. The resist has the element Cl added thereto.

As shown in FIG. 4, blur is reduced by the effect of an additional element when the wavelength is in the region between the absorption edge and half of it. When the element Cl is added to the resist, blur caused by secondary electrons is reduced when the wavelength is between 2.2 angstroms, which is a half of the absorption edge, and 4.4 angstroms, which is the absorption edge.

Figure 5:
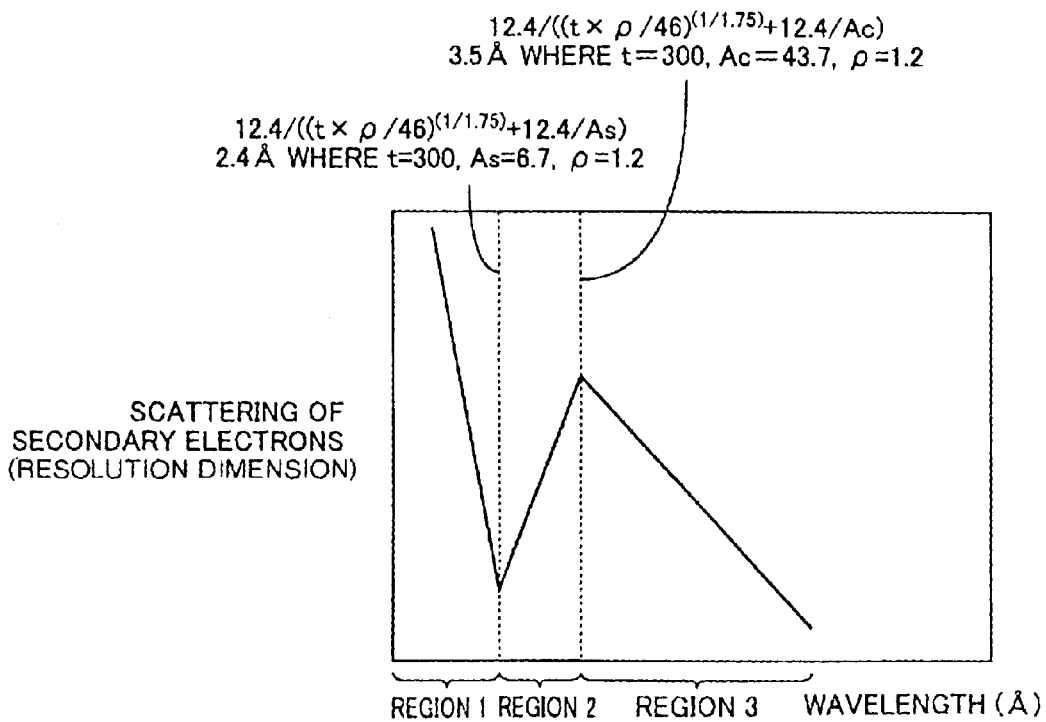
FIG. 5 is a graph showing an influence of secondary electrons produced in the lower layer film and Si substrate on pattern resolution.

Next, the novel findings stated above will be described referring to FIG. 5. FIG. 5 shows scattering of secondary electrons for each exposure wavelength at the boundary between resist 11 and lower layer film 13 when x-rays illuminate resist 11 provided on substrate 12, with lower layer film 13 between them. Here, the influence of the element added to resist 11 is not taken into consideration.

As shown in FIG. 5, exposure wavelengths are divided into three regions. In region 1, blur occurs under the influence of secondary electrons produced in substrate 12. Region 3 is where secondary electrons produced in substrate 12 have no influence but blur occurs under the influence of secondary electrons generated from lower layer film 13. In this region, there is more blur caused by secondary electrons as the wavelength decreases. In Region 2, which has been found as a novel feature, secondary electrons produced in substrate 12 have no influence, but there is an increasing influence of secondary electrons produced in lower layer film 13 as the wavelength increases.

The wavelengths on the boundaries between these three regions can be derived, for example, from the range of an electron beam, also known as the Grun range, which is described for example in "The Innovation of ULSI Lithography". The Grun range R is provided by:

$$R = (46/\rho) \times E^{1.75}$$

where $\rho$ is the density (g/cm³) of lower layer film 13, E is the energy (keV) of the secondary electrons generated. The Grun range R corresponds to the film thickness t (nm) of lower layer film 13, when scattering of secondary electrons at the boundary between resist 11 and lower layer film 13 is considered.

When secondary electrons are photoelectrons it is possible to provide: (energy of the generated secondary electrons E)=(absorbed x-ray energy)−(energy for the absorption edge), therefore: (absorbed x-ray energy)=$(t \times \rho/46)^{(1/1.75)}$+ (energy for the absorption edge). Generally, there is further the relation: wavelength (angstrom)=12.4/energy (keV).

The wavelength of region 2 ranges from $12.4/((t \times \rho/46)^{(1/1.75)} + 12.4/As)$ to $12.4/((t \times \rho/46)^{(1/1.75)} + 12.4/Ac)$ where, in the case that the element that absorbs the largest amount of x-rays of all the elements composing substrate 12 is the element Si, the absorption edge of the element Si with the greatest x-ray absorption coefficient within the exposure spectrum is As (angstrom), and where, in the case that the element that absorbs the largest amount of x-rays within the exposure spectrum of all the elements composing lower layer film 13 is the element C, the K-shell absorption edge of the element C is the Ac (angstrom).

Now consider the effect of suppression of secondary electrons brought about by the elements composing resist 11. When the absorption edge of the element absorbing the largest amount of x-rays within the exposure spectrum of all the elements that composes resist 11 is Ar (angstrom), it is preferable to satisfy the relation: $0.5 \times Ar < 12.4/((t \times \rho/46)^{(1/1.75)} + 12.4/Ac) < Ar$. As described above, blur is reduced by the effect of an additional element when the wavelength is between the absorption edge (Ar) and half of it (0.5×Ar). Thus, by satisfying this relation, it is possible to suppress a peak of scattering of secondary electrons generated at a wavelength covering regions 2 and 3.

In this case, where the average wavelength $\lambda$ of x-rays absorbed in the resist is provided by: $12.4/((t \times \rho/46)^{(1/1.75)} + 12.4/As) \leq \lambda \leq Ar$, using x-rays of shorter wavelengths, the influence of secondary electrons produced in lower layer film 13 can be eliminated by the effect of suppression of secondary electrons brought about by an element composing resist 11 shown in FIG. 4. Thus, while suppressing increase of blur caused by secondary electrons when x-rays of shorter wavelengths are used, it is possible to reduce the effect of Fresnel diffraction, resulting in an improved resolution.

Figure 6:
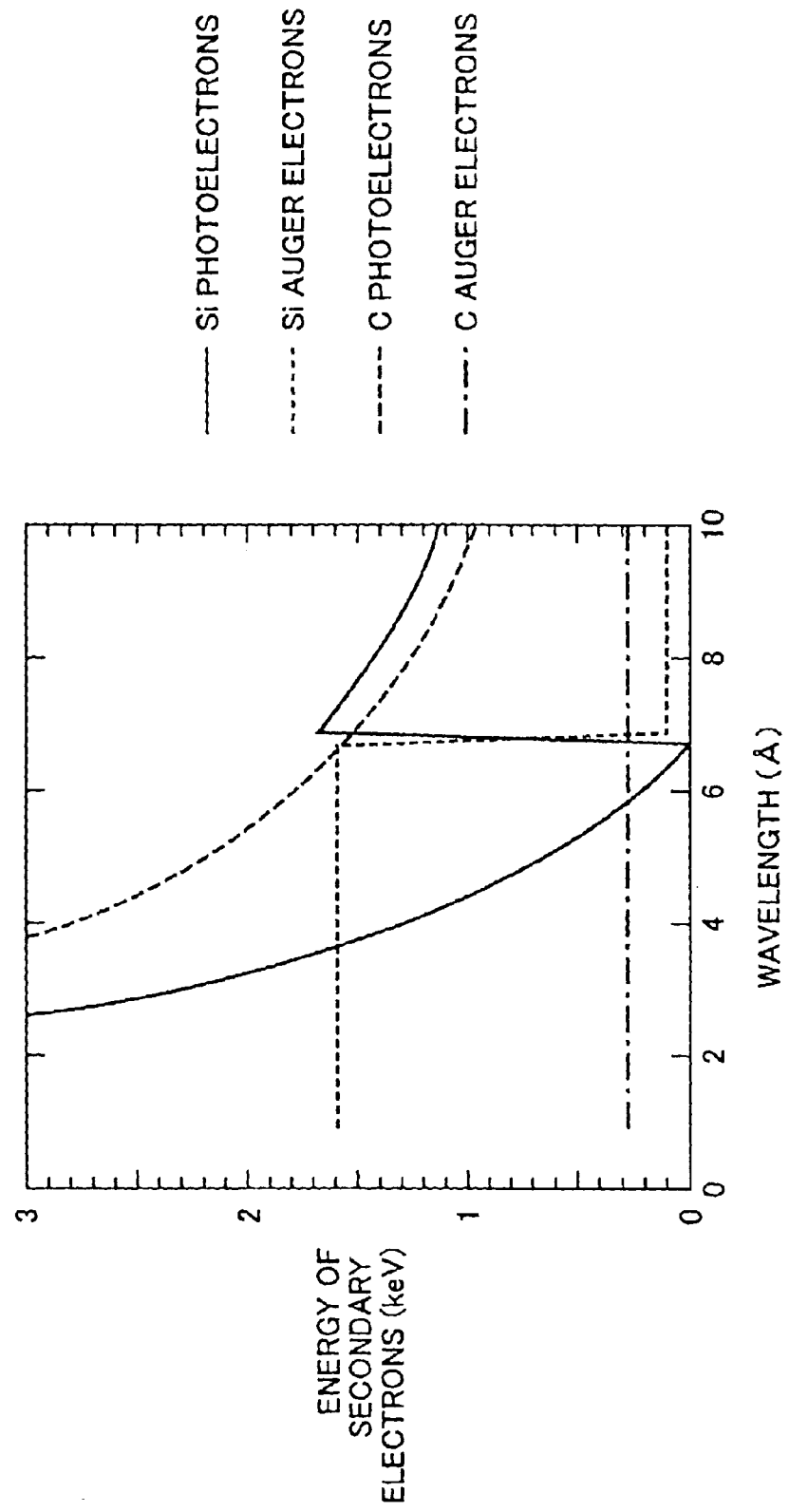
FIG. 6 is a graph showing the energy of main secondary electrons generated during absorption of x-rays by the element C, which is contained in the lower layer film, and by an element Si, which is contained in the substrate.

Region 2 exists when the range of secondary electrons produced in lower layer film 13 containing the element C as a main component (i.e. photoelectrons of the element C) is greater than the film thickness of lower layer film 13. As shown in FIG. 6, for wavelengths shorter than 6.7 angstroms, which is the absorption edge of the element Si, the energy of secondary electrons generated by the element Si is always smaller than that by the element C. Therefore, the range of secondary electrons emitted from the element Si is always smaller than the range of photoelectrons emitted from the element C for wavelengths shorter than 6.7 angstroms. Thus, region 2 exists where the resolution of a pattern is not affected by secondary electrons because the range of secondary electrons produced in lower layer film 13 containing the element C as a main component (i.e. photoelectrons of the element C) is grater than the film thickness of lower layer film 13, and the range of secondary electrons generated in the element Si is smaller than the film thickness of lower layer film 13.

The energy of photoelectrons is represented by: (energy of photoelectrons)=(incident x-ray energy)−(bound energy of inner shell). Where the wavelength of absorbed x-rays is 2.5 angstroms, the energy of photoelectrons generated in substrate 12 of the element Si is 12.4/2.5−12.4/6.7=3.12 keV, since the absorption edge of the element Si is 6.7 angstroms. Also, the energy of Auger electrons is represented by: (energy of Auger electrons)=(bound energy of inner shell)−2×(bound energy of outer shell), therefore: 12.4/6.7−2×(0.148+0.100+0.099)/3=1.61 keV. Thus, since the energy of photoelectrons is greater, the range is longer.

The Grun range R of photoelectrons in lower layer film 13 is represented by: R=46/1.2×3.12$^{1.75}$=281 nm, where the density of the lower layer film is 1.2 g/cm$^3$. In this case, the effect of photoelectrons produced in substrate 12 of Si on resist 11 is eliminated by using lower layer film 13 with a film thickness greater than or equal to 281 nm. To generalize this relationship, the shortest wavelength $\lambda 1$ (angstrom) without an influence of secondary electrons produced from substrate 12 of Si on resist 11 is: $\lambda 1$(angstrom)=12.4/((t×ρ/46)$^{(1/1.75)}$+12.4/As). When the wavelength is longer than $\lambda 1$, the influence of secondary electrons generated by the element Si in substrate 12 on resist 11 is eliminated by inserting therebetween lower layer film 13 with a film thickness t (nm).

Therefore, it is preferable to have the average wavelength of absorbed x-rays greater than or equal to $\lambda 1$ in order to allow a wavelength absorbed by resist 11 to include more of a wavelength greater than or equal to $\lambda 1$. For example, when the film thickness of lower layer film 13 is 300 nm, a wavelength greater than or equal to 2.4 angstroms is preferable, because secondary electrons generated by the element Si contained in substrate 12 does not have an influence on resist 11.

Now, lower layer film 13 containing the element C is considered. Here, lower layer film 13 is formed of polyhydroxystyrene ($C_8H_8O$). Of the elements composing polyhydroxystyrene, the element C has the greatest x-ray absorption coefficient. Since the K-shell absorption edge of the element C is 43.7 angstroms, the energy of photoelectrons generated during absorption of x-rays with a wavelength of 3.5 angstroms is: 12.4/3.5−12.4/43.7=3.26 keV. The energy of Auger electrons is: 0.284−0.06×2=0.272 keV. Photoelectrons have greater energy than Auger electrons, and therefore have a longer range.

The Grun range R of the photoelectrons produced in lower layer film 13 is represented by: R=(46/1.2)×3.26$^{1.75}$=303 nm. Where the film thickness of lower layer film 13 is 300 nm, when the wavelength is shorter than 3.5 angstroms, some of photoelectrons generated on one surface of lower layer film 13 penetrate lower layer film 13 and fly out of the other surface thereof. More generally, the wavelength $\lambda 2$ (angstrom) with such a phenomenon can be represented by: $\lambda 2$=12.4/((t×ρ/46)$^{(1/1.75)}$+12.4/Ac).

Figure 7:
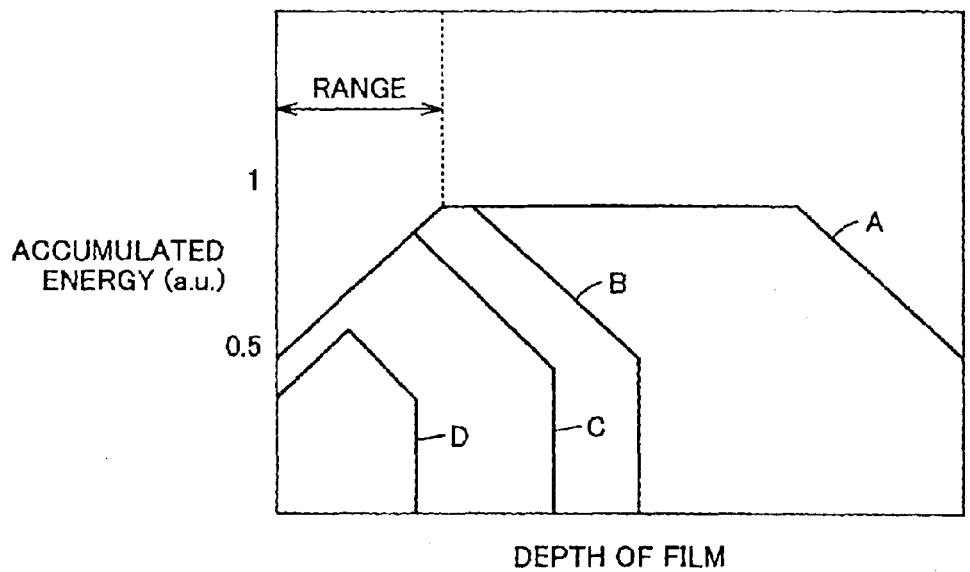
FIG. 7 is a graph showing schematically the distribution of accumulated energy versus the depth of the film when x-rays are irradiated on the entire surface of the thin film.

When the range of photoelectrons produced in lower layer film 13 is greater than the film thickness of lower layer film 13, there is less effect of photoelectrons generated in lower layer film 13 on resist 11. FIG. 7 shows schematically the distribution of accumulated energy versus the depth of a thin film, when x-rays are directed to illuminate the entire surface of the film. In FIG. 7, the origin of the graph is the surface of the thin film. In FIG. 7, as denoted with A, the energy accumulated in the middle of the film remains constant when the film thickness is sufficiently greater than the range, and the energy accumulated at the film surface is half of that in the middle of the film. This is because, on the film surface, energy is lost corresponding to the energy of the secondary electrons flying out of the film surface toward outside of the film, while there are no secondary electrons coming from outside. If this film has a resist thereon, part of the energy of the secondary electrons flying out is accumulated in the resist.

In FIG. 7, the amount of energy that is lost on the film surface remains the same when the film thickness is greater than the range, as indicated by B and C even with thinner films. As indicated by D, the energy on the film surface decreases when the film thickness is smaller than the range. This means that less energy flies toward the outside of the film. Thus, when, in a two-layer structure of a resist and a lower layer film, the range of photoelectrons generated in the lower layer film is greater than the film thickness of the lower layer film, the photoelectrons generated in the lower layer film lose less energy in the resist. Due to a large influence of blur caused by photoelectrons generated in the lower layer film on the resolution, a less energy provides an improved resolution.

As is obvious from the calculations provided above, where, for example, the film thickness of lower layer film 13 is 300 nm, when the wavelength is between 2.4 and 3.5 angstroms, there is no influence of secondary electrons produced in substrate 12 of Si and the range of the photoelectrons produced in lower layer film 13 is greater than the film thickness of lower layer film 13. Now the appropriate elements to be added to resist 11 under such conditions are considered.

Where the absorption edge of the element contained in the resist is Ar (angstrom), blur caused by secondary electrons generated from the lower layer film can be effectively eliminated when 0.5×Ar<3.5 (that is, Ar<7.0). Si, P, S, Cl and the like can be named as elements having such absorption edges. Such elements are effective when added to resist 11.

A similar calculation for the film thickness of a lower layer film of 200 nm gives 2.8<Ar and 0.5×Ar<4.3 (that is, Ar<8.6). Si, P, S, Cl, Br and the like can be named as elements having such absorption edges. In this way, elements added to resist 11 can be chosen based on the film thickness of the lower layer film.

The x-ray exposure method according to the present embodiment can be summarized as follows: x-rays 32 generated by an x-ray source 31 are directed through an x-ray mask 36 to illuminate a resist 11 that has been stacked on a substrate 12 with a lower layer film 13 in between; lower layer film 13 contains an element C, and is composed in such a way that the element which absorbs the largest amount of x-rays of all the elements contained in lower layer film 13 is the element C; and when the film thickness of lower layer film 13 is t (nm), the density of lower layer film 13 is ρ (g/cm³), the absorption edge of the element that absorbs the largest amount of x-rays of all the elements contained in substrate 12 is As (angstrom), the K-shell absorption edge of the element C is As (angstrom), and the absorption edge of the element that absorbs the largest amount of x-rays of all the elements contained in resist 11 is Ar (angstrom), then resist 11 and lower layer film 13 are used that satisfy the relation: $0.5 \times Ar < 12.4/((t \times \rho/46)^{(1/1.75)} + 12.4/Ac) < Ar$; under these conditions, x-rays are radiated such that the relation: $12.4/((t \times \rho/46)^{(1/1.75)} + 12.4/As) \leq \lambda \leq Ar$ is satisfied by the average wavelength λ (angstrom) of x-rays absorbed in resist 11.

X-ray exposure in the manner described above allows the influence of secondary electrons generated by substrate 12 to be eliminated, due to the effect of lower layer film 13. Also, by adding to resist 11 an element having the absorption edge Ar as described above, it is possible to suppress the influence of secondary electrons produced in lower layer film 13, while using x-rays with a relatively short wavelength, resulting in a good patterning on resist 11.

Figure 8:
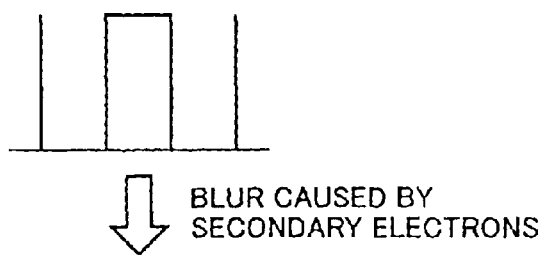
FIG. 8 illustrates the concept of image contrast.
Figure 8:
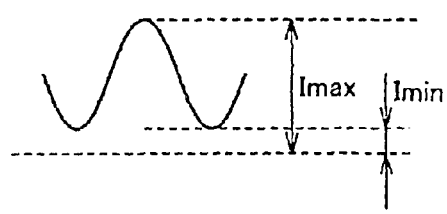

Now, suppose that an x-ray optical image is rectangular as shown in FIG. 8, and estimation was performed for the energy distribution of the energy accumulated in the resist, as a result of degradation of the optical image by the blur caused by secondary electrons, using an image contrast IC, defined as IC=(Imax−Imin)/(Imax+Imin). The image contrast IC is an index for evaluating an image of the energy accumulated in the resist, and is closely related to patterns that are actually transferred, and to the resolution. Imax and Imin represent the magnitude of the energy accumulated in the resist, directly under the gaps with no x-ray absorber 25 and directly under x-ray absorber 25, respectively. The image contrast IC ranges from 0 to 1, and the greater this value, better the patterning and the resolution.

The calculation below relates to a wavelength region without an influence from substrate 12 of Si (greater than or equal to 2.5 angstroms). For the calculation, polyhydroxystyrene ($C_8H_8O$) with a film thickness of 300 nm was used as lower layer film 13 inserted between substrate 12 and resist 11.

Figure 9:
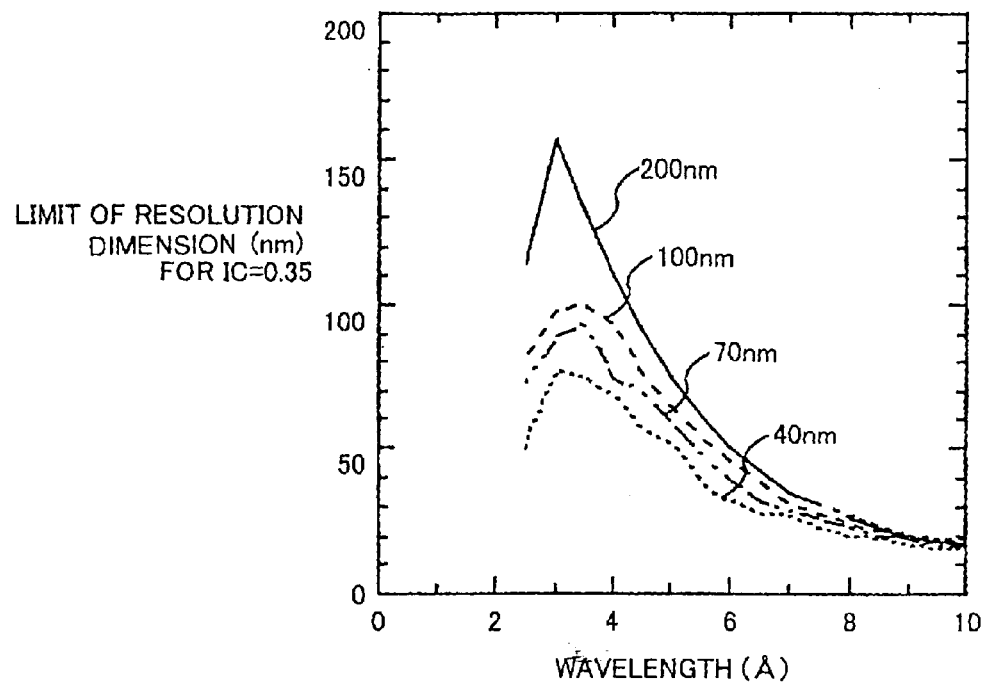
FIG. 9 is a graph showing the wavelength dependence of limit of resolution dimension when it is supposed that resolution is provided at an image contrast of IC=0.35.

A resist with a density of 1.2 g/cm³ formed of the C, H, O elements was used as resist 11, and a calculation was done for a film thickness ranging from 40 to 200 nm. FIG. 9 shows the wavelength dependence of limits of resolution dimension when a resolution is supposed to be at an image contrast of IC=0.35. FIG. 9 shows that blur caused by secondary electrons decreases as limit of resolution dimension decreases. According to this, approximately 3.5 angstroms is the peak, and when the x-ray wavelength is shorter than the peak, blur caused by secondary electrons is reduced as the wavelength decreases, as demonstrated in the considerations using the Grun range. Further, a smaller film thickness of resist 11 reduces blur caused by secondary electrons. This is because secondary electrons produced in resist 11 are released before they are scattered here.

Figure 10:
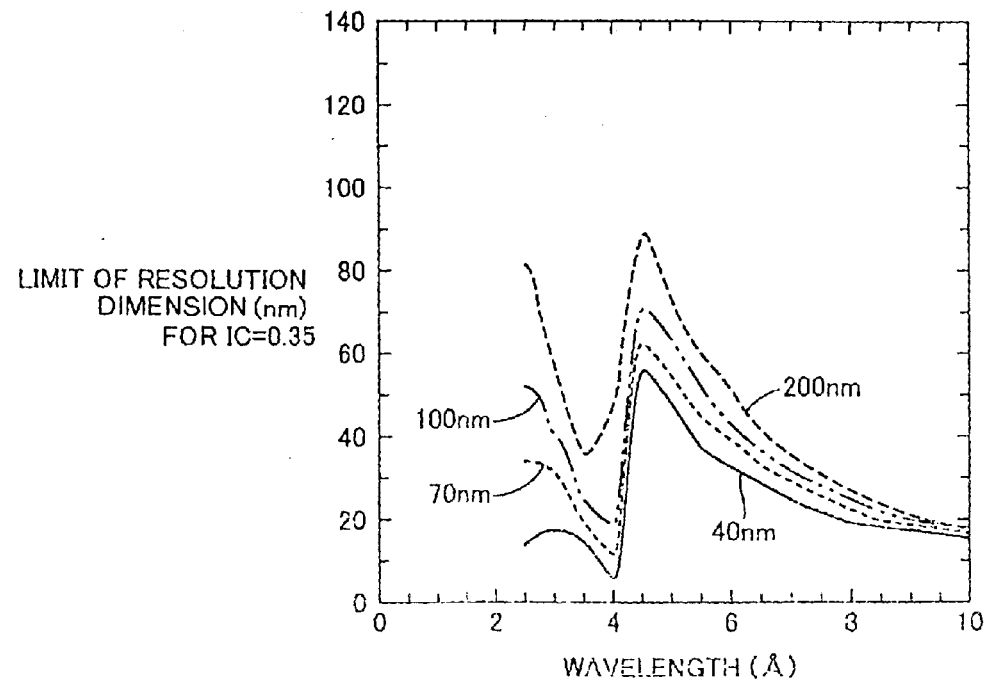
FIG. 10 is a graph showing the wavelength dependence of limit of resolution dimension when it is supposed that resolution is provided at an image contrast of IC=0.35 and when an element Cl is added to the resist.

Next, a similar evaluation is performed for resist 11 containing 15 wt % of Cl. The film thickness of lower layer film 13 is also 300 nm. The result of this calculation is shown in FIG. 10. As shown in FIG. 10, there is no peak as appears in FIG. 9 about 3.5 angstroms. This is because blur caused by secondary electrons of lower layer film 13 is reduced by including the element Cl in resist 11. Also, like in FIG. 9, a smaller film thickness of resist 11 allows blur caused by secondary electrons to be reduced.

Note that this effect of reduction due to the element Cl is significant for wavelengths shorter than the K-shell absorption edge of the element Cl. This is because, for wavelengths shorter than the K-shell absorption edge of the element Cl, the x-ray absorption coefficient of the element Cl is greater than that of the element C, which is a main one of the elements constituting lower layer film 13, thereby reducing the influence of secondary electrons generated in lower layer film 13 containing the element C as a main component. Further, the x-ray energy absorbed by the element Cl is very large when the wavelength is between 3.5 and 4 angstroms i.e. near the absorption edge on the side of shorter wavelengths of the element Cl. Thus, adding the element Cl provides a greatly improved resist patterns when the wavelength is between 3.5 and 4 angstroms. Scattering of secondary electrons is smaller when using a wavelength between 3.5 and 4 angstroms than using 8 angstroms used conventionally, for any film thickness of resist 11 of 100 nm or less. Therefore, the film thickness of resist 11 is preferably 100 nm or less.

For a film thickness of resist 11 of 40 nm, blur caused by secondary electrons is reduced when using wavelengths ranging from 2.5 angstroms, at which the influence of secondary electrons from the element Si contained in substrate 12 appears, to 4 angstroms, near the absorption edge of the element Cl on the side of shorter wavelengths, in comparison with blur caused by secondary electrons when using 8 angstroms, which has been conventionally considered as optimal. Therefore, it is more preferable to have a film thickness of resist 11 of 40 nm or less.

Increasing the content of the element Cl in resist 11 provides a greater effect of decreased blur caused by secondary electrons, thus, using a greater film thickness of resist 11, an improvement over blur caused by secondary electrons generated at 8 angstroms as used conventionally.

In this way, an exposure using x-rays of wavelengths shorter than the wavelength of 8 angstroms used conventionally not only allows the influence of secondary electrons to be decreased, but also improves the resolution determined by Fresnel diffraction, thereby allowing a finer patterning.

It should be noted that the film thickness of resist 11 is greater than 10 nm, to provide for the step of etching lower layer film 13.

EXAMPLES

Figure 11:
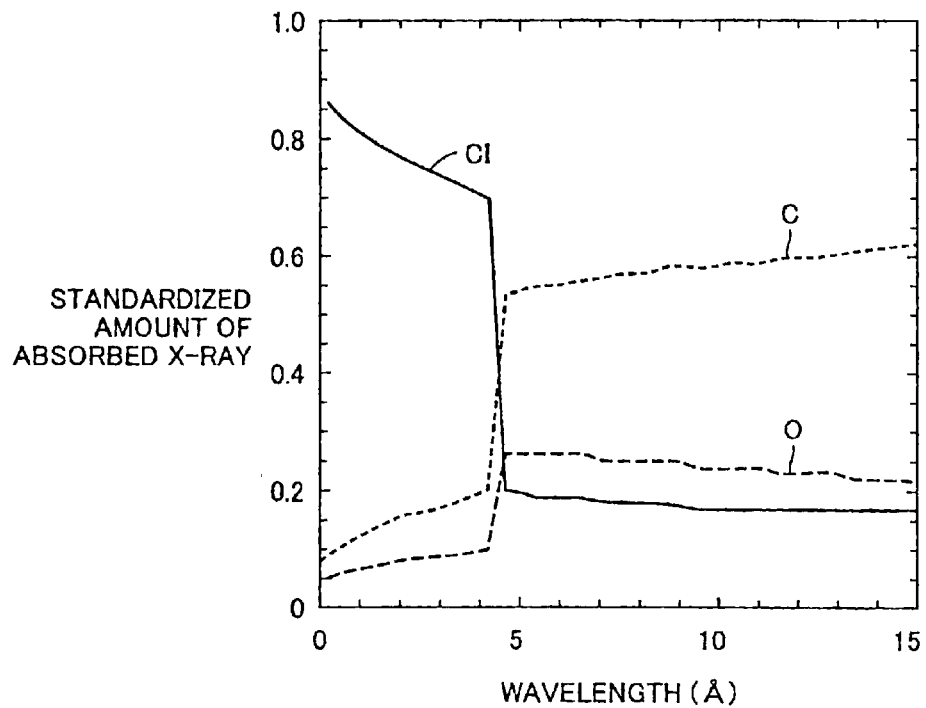
FIG. 11 is a graph showing the amount of x-ray absorption of each element for each x-ray wavelength, where the amount of x-ray absorbed in the entire resist is 1.

The element Cl was chosen as the element to be added to resist 11 having a specific wavelength absorption edge within the exposure wavelength. As resist 11, $C_{13}H_{15}O_2Cl_1$ having 15 wt % of Cl added thereto was selected. The film thickness of resist 11 was 70 nm. FIG. 11 shows the amount of x-ray absorption of each element for each x-ray wavelength, where the amount of x-ray absorption in the entire resist 11 was 1. The amount of absorption of the element H is not shown since it was almost zero. It will be apparent that, when the wavelength is below the K-shell absorption edge of the element Cl (4.4 angstroms), the element Cl absorbs the largest amount of x-rays of the elements composing the resist, accounting for more than half of the total absorption, and secondary electrons produced in the element Cl are dominant. When using a resist with a further increased content of the element Cl, secondary electrons generated from the element Cl are still more dominant.

As radiation generating device 31 shown in FIG. 1, a device having a ring with an orbit radius of 0.593 m and an energy of 0.585 GeV was used. A radiation generating device generating x-rays by bremsstrahlung is described, although a radiation generating device using characteristic x-radiation, such as a plasma x-ray source can be used to achieve a similar effect.

The optimal material for mirror 33 differs depending on the x-ray incidence. In the present embodiment, the x-ray incidence is 89 degrees, and in this case materials with higher atomic numbers, such as Hf, Ta, W, Re, Os, Ir, Au, Pt or alloys thereof are preferable, due to their higher reflectivity for the wavelength below the K-shell absorption edges of the element Cl. Mirror 33 used is formed of a $SiO_2$ substrate with Pt vapor-deposited thereon. Also, in the case of a greater x-ray incidence to mirror 33, light with shorter wavelengths can be reflected, thereby allowing a higher reflectivity using a variety of materials, such as Ti, V, Cr, Mn, Fe, Co, Ni, Cu, Zn, Ru, Rh, Pd, Ag, or alloys thereof, or nitride, carbide, boride, diamond, DLC (diamond like carbon) or boron nitride. It should be noted that, although x-rays are reflected here using two mirrors 33, a similar effect can be obtained using only one mirror 33, or even no mirror at all.

As filter 34, a filter with a thickness of 100 μm made of polyimide film, such as Kapton (registered trademark) was used. For comparison, experiment was performed for different wavelengths using no filter 34. The thickness of beryllium window 35 was 20 μm.

Diamond was used as membrane 23 shown in FIG. 2, and Cr was used as etching stopper 24. W was used as x-ray absorber 25, which had a thickness of 500 nm when used with a filter, and a thickness of 300 nm when used without a filter.

Si was used for substrate 12 of FIG. 3, and a lower layer film 13 with a thickness of 300 nm was inserted between substrate 12 and resist 11, lower layer film 13 being made by baking a resist containing the element C as a main component at a high temperature (300 degrees centigrade) to make inert its property as a resist.

Figure 12:
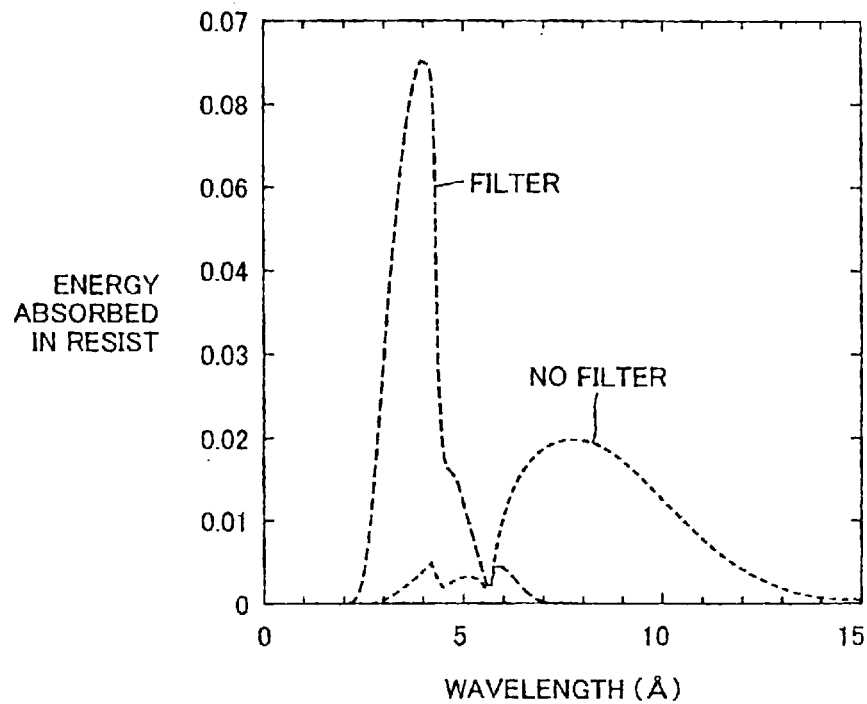
FIG. 12 is a graph showing the energy spectrums of the energy absorbed in resist 11 when there is a filter and when there is not, respectively.

FIG. 12 shows energy spectrums of the energy absorbed in resist 11 with and without a filter under the above condition. In FIG. 12, the total energy absorbed was standardized as 1. The average wavelength, which is in the center of the intensity of exposed energy, is 3.9 angstroms in the case with a filter, and 8.3 angstroms without a filter. 8.3 angstroms almost equals to 8 angstroms that was conventionally considered to be optimal. Also, the range of the main exposure wavelengths is between 3.0 to 4.4 angstroms when there is a filter, and between 6 to 12 angstroms when there is no filter.

The distance between resist 11 and x-ray absorber 25 was 10 μm, and a 60 nm L&S (line and space) pattern was transferred under the above condition, resulting in resist patterns with a shape that is more preferable when using a filter than using no filter: transfer of a pattern with high quality was possible that corresponded more closely to the pattern of x-ray absorber 25 of x-ray mask 36 when x-rays were irradiated for exposure in such a way that x-rays of the average wavelength of 3.9 angstroms were absorbed, than the case when x-rays were irradiated for exposure in such a way that x-rays of the average wavelength of 8.3 angstroms were absorbed.

Figure 13A:
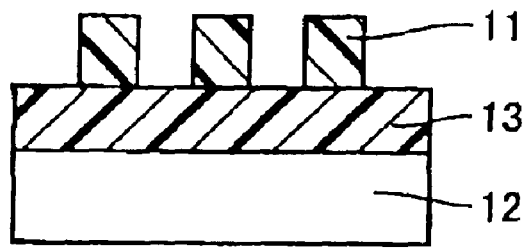
FIGS. 13A–13D are cross sections illustrating a process of transferring a pattern formed on a resist onto a lower layer film.
Figure 13B:
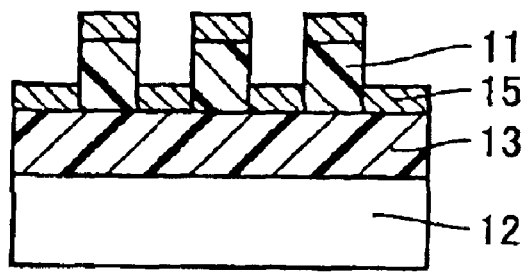

Finally, referring to FIGS. 13A to 13D, a method is described of transferring a pattern on a lower layer film 13 after patterning on a resist 11 as in FIG. 13A. Referring to FIG. 13B, material 15 with a film thickness that is smaller than that of the resist is formed by sputtering. Si is used here as material 15. Alternatively, $SiO_2$, Cr, W, Ta and the like can be used as material 15 instead of Si.

Figure 13C:
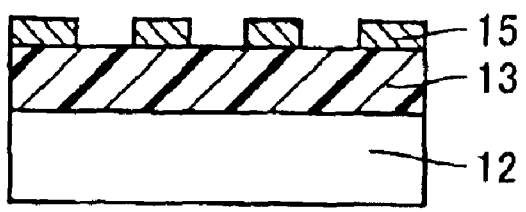
Figure 13D:
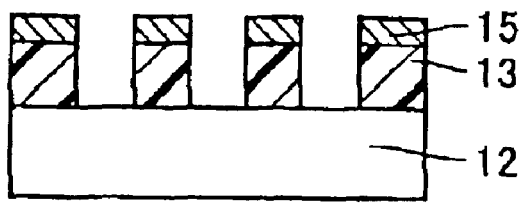

Referring to FIG. 13C, substrate 12 is immersed in a liquid in which resist 11 resolves, resulting in a pattern of metal film that is a reversed pattern of that of the resist. Referring to FIG. 13D, etching is performed using a gas containing $O_2$ to remove an unnecessary portion from lower layer film 13. Note that lower layer film 13 can be easily etched because the selectivity of lower layer film 13 for the gas containing $O_2$ is higher than that of material 15. In this way, a pattern can be transferred to lower layer film 13.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An x-ray exposure method comprising directing x-rays generated by an x-ray source to illuminate, through a mask, a resist on a substrate with a lower layer film interposed between the resist and the substrate, wherein the lower layer film contains C, and, of elements contained within the lower layer, the element absorbing a largest amount of x-rays is C, when thickness of the lower layer film is t (nm), density of the lower layer film is ρ (g/cm³), absorption edge of an element absorbing a largest amount of x-rays of elements contained in the substrate is As (angstrom), K-shell absorption edge of C is Ac (angstrom), and absorption edge of an element absorbing a largest amount of x-rays of elements contained in the resist is Ar (angstrom), then: $0.5 \times Ar < 12.4/((t \times \rho/46)^{1/1.75} + 12.4/Ac) < Ar$, and
$12.4/((t \times \rho/46)^{1/1.75} + 12.4/As) \leq \lambda \leq Ar$ is satisfied by an average wavelength λ (angstrom) of x-rays absorbed in the resist.

2. The x-ray exposure method according to claim 1, wherein the element absorbing a largest amount of x-rays of the elements contained in the resist is Cl, and thickness of the resist is no more than 100 nm.

3. The x-ray exposure method according to claim 2, wherein the thickness of the resist is no more than 40 nm.

* * * * *